United States Patent
Yoshinari

(10) Patent No.: US 10,093,572 B2
(45) Date of Patent: Oct. 9, 2018

(54) MANUFACTURING METHOD FOR $SiO_2$-$TiO_2$ BASED GLASS AND MANUFACTURING METHOD FOR PHOTOMASK SUBSTRATE MADE OF $SiO_2$-$TiO_2$ BASED GLASS

(71) Applicant: NIKON CORPORATION, Tokyo (JP)

(72) Inventor: Toshio Yoshinari, Machida (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/660,561

(22) Filed: Mar. 17, 2015

(65) Prior Publication Data
US 2015/0183677 A1 Jul. 2, 2015

Related U.S. Application Data

(63) Continuation of application No. PCT/JP2013/074643, filed on Sep. 12, 2013.

(30) Foreign Application Priority Data

Sep. 18, 2012 (JP) ................................ 2012-204377

(51) Int. Cl.
*C03B 19/14* (2006.01)
*C03B 11/08* (2006.01)
(Continued)

(52) U.S. Cl.
CPC .......... *C03B 19/1415* (2013.01); *C03B 11/08* (2013.01); *C03B 19/1469* (2013.01);
(Continued)

(58) Field of Classification Search
CPC . C03B 19/1415; C03B 19/1469; C03B 11/08; C03B 23/0493; C03B 32/005;
(Continued)

(56) References Cited

U.S. PATENT DOCUMENTS 5,180,411 A * 1/1993 Backer .................. C03B 37/014
65/17.4
6,189,339 B1 * 2/2001 Hiraiwa .............. C03B 19/1415
65/17.3
(Continued)

FOREIGN PATENT DOCUMENTS

CN 101959820 A 1/2011
JP 2002-53330 2/2002
(Continued)

OTHER PUBLICATIONS

PCT International Preliminary Report on Patentability and Written Opinion of the International Searching Authority issued Mar. 24, 2015 in corresponding International Patent Application No. PCT/JP2013/074643.
(Continued)

*Primary Examiner* — Queenie S Dehghan

(57) ABSTRACT

A method for manufacturing an $SiO_2$—$TiO_2$ based glass upon a target by a direct method, includes: an ingot growing step of growing an $SiO_2$—$TiO_2$ based glass ingot having a predetermined length on the target by flame hydrolysis by feeding a silicon compound and a titanium compound into an oxyhydrogen flame, wherein the ingot growing step includes: a first step of increasing a ratio of a feed rate of the titanium compound to a feed rate of the silicon compound as the $SiO_2$—$TiO_2$ based glass ingot grows until the ratio reaches a predetermined value; and a second step of gradually growing the $SiO_2$—$TiO_2$ based glass ingot after the ratio has reached the predetermined value in the first stage with keeping the ratio within a predetermined range.

10 Claims, 2 Drawing Sheets

(51) Int. Cl.
*C03C 3/06* (2006.01)
*G03F 1/60* (2012.01)
*C03B 23/049* (2006.01)
*C03B 32/00* (2006.01)

(52) U.S. Cl.
CPC ........ C03B 23/0493 (2013.01); C03B 32/005 (2013.01); C03C 3/06 (2013.01); G03F 1/60 (2013.01); *C03B 2201/42* (2013.01); *C03B 2207/70* (2013.01); *C03B 2207/80* (2013.01); *C03B 2215/44* (2013.01); *C03C 2201/42* (2013.01); *C03C 2203/44* (2013.01)

(58) Field of Classification Search
CPC ............ C03B 2201/42; C03B 2207/70; C03B 2207/80; C03B 2215/44; C03C 3/06; C03C 2201/42; C03C 2203/44
USPC .................................. 65/17.4, 377, 414–416
See application file for complete search history.

(56) References Cited

U.S. PATENT DOCUMENTS

| | | | | |
|---|---|---|---|---|
| 6,649,268 B1* | 11/2003 | Komine | ............. | C03B 19/1415 359/642 |
| 7,415,183 B2* | 8/2008 | Okano | ............... | G02B 6/12007 385/123 |
| 8,820,122 B2* | 9/2014 | Maida | ................. | C03B 19/1423 65/414 |
| 2012/0058419 A1 | 3/2012 | Maida et al. | | |
| 2012/0264584 A1 | 10/2012 | Miyasaka et al. | | |

FOREIGN PATENT DOCUMENTS

| | | |
|---|---|---|
| JP | 2011-151386 | 8/2011 |
| JP | 2012-72053 | 4/2012 |
| WO | WO 2009/107858 A1 | 9/2009 |
| WO | WO 2012/105513 A1 | 8/2012 |

OTHER PUBLICATIONS

International Search Report mailed on Dec. 17, 2013 in corresponding International Patent Application No. PCT/JP2013/074643.

Chinese Office Action dated Jun. 27, 2016 in corresponding Chinese Patent Application No. 201380048244.0.

\* cited by examiner

MANUFACTURING METHOD FOR $SiO_2$-$TiO_2$ BASED GLASS AND MANUFACTURING METHOD FOR PHOTOMASK SUBSTRATE MADE OF $SiO_2$-$TiO_2$ BASED GLASS

This is a continuation application of International Application No. PCT/JP2013/074643 filed Sep. 12, 2013.

INCORPORATION BY REFERENCE

The disclosures of the following priority applications are herein incorporated by reference:

Japanese Patent Application 2012-204377 (filed Sep. 18, 2012)

International Application No. PCT/JP2013/074643 (filed Sep. 12, 2013).

BACKGROUND OF THE INVENTION

1. Field of the Invention

The present invention relates to a manufacturing method for $SiO_2$—$TiO_2$ based glass used for optical members such as mirrors, photo-masks and the like in optical application technologies including a photolithographic technology. The invention also relates to a manufacturing method for a photo-mask substrate made of such glass.

2. Description of Related Art

A photolithographic process includes irradiating a photo-sensitive substrate with exposure light through a photo-mask. Such a photo-mask is obtained by forming a predetermined mask pattern upon a photo-mask substrate.

In recent years, the size of photosensitive substrates has increased, and, along with this, the size of photo-masks has also increased. For example, exposure devices for liquid crystal panels from the eighth generation onward use a large-sized photo-mask having a side longer than 1.2 m. A photo-mask substrate that is used for a photo-mask having such a large size can be manufactured from an $SiO_2$ glass cylindrical ingot that is synthesized by a vapor deposition method such as the direct method, and by press-molding this ingot so as to form a flat plate-shaped member (see Japanese Laid-Open Patent Publication 2002-53330).

SUMMARY OF THE INVENTION

Now, the photo-mask absorbs part of the energy in the exposure light, and this absorbed energy is converted into heat, which deforms the photo-mask by thermal expansion. If the coefficient of thermal expansion is the same, the absolute value of the amount of deformation is proportional to the size of the photo-mask and the larger the size of the photo-mask is, the more prominent the influence of thermal expansion is.

To eliminate such thermal deformation of the photo-mask, which affects the precision of the patterning, use of glass having a low coefficient of thermal expansion as a material for a photo-mask substrate has been considered. Specifically, application of an $SiO_2$—$TiO_2$ based glass, which is per se known as a low thermal expansion glass, has been considered.

According to the first aspect of the present invention, a method for manufacturing an $SiO_2$—$TiO_2$ based glass upon a target by a direct method, comprises: an ingot growing step of growing an $SiO_2$—$TiO_2$ based glass ingot having a predetermined length on the target by flame hydrolysis by feeding a silicon compound and a titanium compound into an oxyhydrogen flame, wherein the ingot growing step includes: a first step of increasing a ratio of a feed rate of the titanium compound to a feed rate of the silicon compound as the $SiO_2$—$TiO_2$ based glass ingot grows until the ratio reaches a predetermined value; and a second step of gradually growing the $SiO_2$—$TiO_2$ based glass ingot after the ratio has reached the predetermined value in the first stage with keeping the ratio within a predetermined range.

According to the second aspect of the present invention, in the method for manufacturing an $SiO_2$—$TiO_2$ based glass according to the first aspect, it is preferred that, in the first step, an increment of the ratio per stage upon increasing the ratio in stages is adjusted such that an increment of $TiO_2$ concentration of the $SiO_2$—$TiO_2$ based glass upon increasing the ratio is equal to or less than 1 mass %.

According to the third aspect of the present invention, in the method for manufacturing an $SiO_2$—$TiO_2$ based glass according to the first aspect, it is preferred that, the ratio is adjusted in stages such that an increment of concentration of $TiO_2$ per cm of the length of the $SiO_2$—$TiO_2$ based glass ingot is equal to or less than 1 mass %.

According to the fourth aspect of the present invention, in the method for manufacturing an $SiO_2$—$TiO_2$ based glass according to the first aspect, it is preferred that, the ratio at the start of feeding the silicon compound and the titanium compound is adjusted such that the concentration of $TiO_2$ in the $SiO_2$—$TiO_2$ based glass is equal to or less than 4 mass %.

According to the fifth aspect of the present invention, in the method for manufacturing an $SiO_2$—$TiO_2$ based glass according to the first aspect, it is preferred that, in the first step, the ratio is gradually increased such that the temperature of the growth surface of the $SiO_2$—$TiO_2$ based glass ingot is maintained at a temperature equal to or higher than a predetermined lower limit temperature.

According to the sixth aspect of the present invention, in the method for manufacturing an $SiO_2$—$TiO_2$ based glass according to the fifth aspect, it is preferred that, the predetermined lower limit temperature is 1600° C.

According to the seventh aspect of the present invention, in the method for manufacturing an $SiO_2$—$TiO_2$ based glass according to the first aspect, it is preferred that, in the first step, the ratio is increased in stages.

According to the eighth aspect of the present invention, in the method for manufacturing an $SiO_2$—$TiO_2$ based glass according to the first aspect, it is preferred that, the silicon compound is silicon tetrachloride.

According to the ninth aspect of the present invention, the method for manufacturing an $SiO_2$—$TiO_2$ based glass according to the first aspect, it is preferred that, the titanium compound comprises titanium tetrachloride, tetraisopropoxytitanium or tetrakisdimethylaminotitanium.

According to the tenth aspect of the present invention, in the method for manufacturing an $SiO_2$—$TiO_2$ based glass according to the first aspect, it is preferred that, further comprises a preheating step of preheating the target prior to the ingot growing step.

According to the eleventh aspect of the present invention, in the method for manufacturing an $SiO_2$—$TiO_2$ based glass according to the first aspect, it is preferred that, in the ingot growing step, only the silicon compound is fed into the oxyhydrogen flame to form a growth surface of an $SiO_2$ glass and subsequently feeding of the titanium compound is started.

According to the twelfth aspect of the present invention, a method for manufacturing a photo-mask substrate, the method comprises: a glass manufacturing step of manufacturing an SiO$_2$—TiO$_2$ based glass by the method for manufacturing an SiO$_2$—TiO$_2$ based glass according to the first aspect; a glass cutting out step of cutting out a glass portion which was grown in the second step from the SiO$_2$—TiO$_2$ based glass manufactured in the glass manufacturing step; and a plate-shaped member forming step of forming a plate-shaped member by hot pressure forming the glass portion which was cut out in the glass cutting out step.

DESCRIPTION OF EMBODIMENTS

Now, embodiments of the present invention are explained below.
<Embodiment#1>

Figure 1:
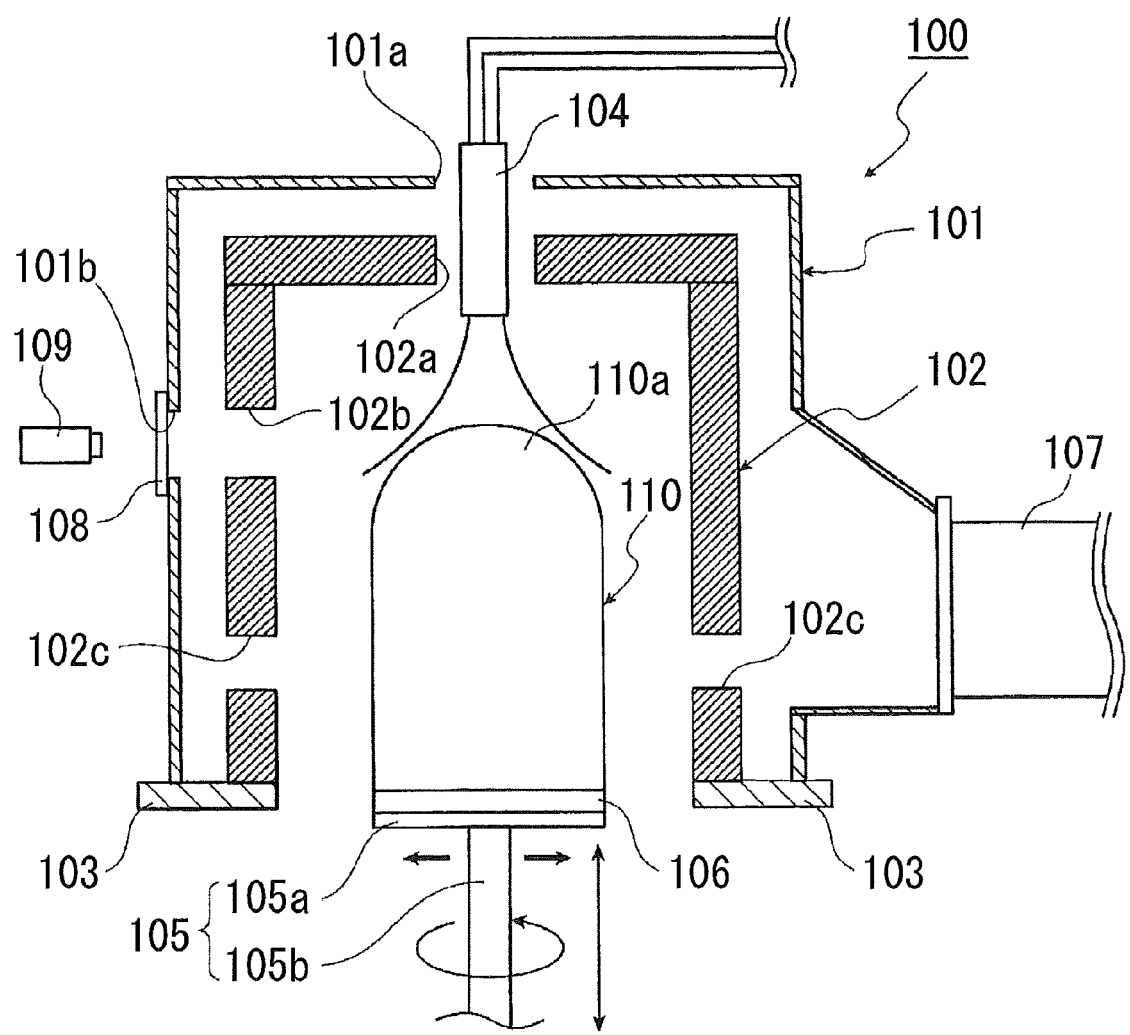
FIG. 1 is a structural diagram showing a glass manufacturing device according to Embodiment #1 of the present invention.

FIG. 1 is a structural diagram showing a glass manufacturing device according to Embodiment #1 of the present invention. As shown in FIG. 1, a glass manufacturing device 100 includes a furnace frame 101, a furnace wall 102 made of a fireproof material, a furnace floor 103 upon which the furnace frame 101 and the furnace wall 102 are disposed, a burner 104, a support member 105, and a target member 106.

The furnace wall 102 is disposed in the interior of the furnace frame 101. Through ports 101a and 102a for passing the burner 104 are provided in the upper portions of the furnace frame 101 and of the furnace wall 102 respectively. Moreover, viewing ports 101b and 102b for observing the growth surface 110a of a glass ingot 110 are provided in the side portions of the furnace frame 101 and of the furnace wall 102 respectively. Furthermore, a transparent glass window 108 is provided in the viewing port 101b.

A radiation thermometer 109 is disposed at the exterior of the furnace frame 101 to enable measurement of the temperature of the growth surface 110a of the glass ingot 110 through the viewing ports 101b and 102b.

Evacuation ports 102c are provided at the side portions of the furnace wall 102 to discharge chlorine gas generated as a by-product of the glass formation reaction, minute glass particles that have not been deposited upon the growth surface 110a, and so on. Such chlorine gas and minute glass particles discharged from the evacuation ports 102c are conducted to an evacuation conduit 107 and discharged through a scrubber not shown in the figures.

The glass manufacturing device 100 includes, inside the furnace wall 102, the target member 106, upon the upper surface of which the glass ingot 110 grows, and the support member 105, which supports the lower surface of the target member 106. The support member 105 has a circular disk shaped portion 105a and a rod shaped portion 105b, and is configured to allow for its rotation, tilting, and shifting up and down, as desired, as driven by a drive device not shown in the figures that is connected to one end of the rod shaped portion 105b. Moreover, the target member 106 is formed in the shape of a circular disk having substantially the same diameter as the circular disk shaped portion 105a of the support member 105, and is disposed in a position to oppose the burner 104.

The SiO$_2$—TiO$_2$ based glass according to Embodiment #1 is manufactured by the following procedure. First, in a target rotation step, the target member 106 is rotated at a predetermined speed via the support member 105 by the drive device not shown in the figures.

Subsequently, in a preheating step, oxygen gas and hydrogen gas are flowed to the burner 104 at respective predetermined flow rates to generate an oxyhydrogen flame, which heats the target member 106 keeping at a fixed distance from the burner 104. During the preheating step, the temperature of the target member 106 is monitored with the radiation thermometer 109, and, when the temperature reaches a predetermined temperature, the procedure proceeds to an ingot growth step.

In the ingot growth step, the temperature of the growth surface, the speed of generation of glass, and other manufacturing conditions normally change depending on the feed rates of glass raw material gases and of combustion gases to the burner and other manufacturing parameters. Thus, to deposit glass of a constant composition at a constant speed in a stable manner, it is useful to optimize these manufacturing parameters by achieving a delicate balance among all of them. To this end, it is simplest and easiest, for a person skilled in the art who intends to manufacture an SiO$_2$—TiO$_2$ based glass in which TiO$_2$ is doped into an SiO$_2$ glass, to manufacture such glass fundamentally based on the conventional manufacturing condition for SiO$_2$ glass but with replacing a portion of the SiO$_2$ precursor (i.e., silicon compound) to be supplied to the burner by the TiO$_2$ precursor (i.e., titanium compound), while keeping the other conditions the same as before.

However, further research by the inventors indicates that simply replacing a portion of the SiO$_2$ precursor by the TiO$_2$ precursor using the conventional manufacturing conditions for an SiO$_2$ glass without alterations, generates local convex portions soon after the start of growth of the ingot at the growth surface. These convex portions grow preferentially over time to increase the degree of concavo-convexity of the growth surface steadily. If this phenomenon advances to an extent in which the convexoconcave of the growth surface is too large to allow steady growth of the ingot, it becomes impossible to manufacture a large sized ingot under such manufacturing conditions.

Further investigations by the inventors have clarified that use of the manufacturing conditions described below in the ingot growth step can solve this problem to enable manufacture of SiO$_2$—TiO$_2$ based glass suitable for use in the manufacture of large photo-mask substrates by the direct method.

The ingot growth step of Embodiment #1 proceeds as described below. First, only the SiO$_2$ precursor is fed into oxyhydrogen flame for a predetermined time to form a growth surface of SiO$_2$ glass. This is done by feeding the SiO$_2$ precursor to the burner 104 at a predetermined flow rate to hydrolyze it in the oxyhydrogen flame, thus generating minute glass particles. The generated minute glass particles deposit on the target member 106 and simultaneously melted in the flame to form silica glass. Subsequently, feeding of the TiO$_2$ precursor is started. That is, the SiO$_2$ precursor and the TiO$_2$ precursor are simultaneously fed at their respective flow rates to the burner 104 to allow for hydrolysis in the oxyhydrogen flame to generate minute glass particles. The minute glass particles generated accumulate on the target member 106 and melted by the flame to be vitrified, thus forming SiO$_2$—TiO$_2$ based glass.

Upon making silica glass and SiO$_2$—TiO$_2$ based glass, the target member 106 is pulled downward at a speed equal to the speed of deposition of the minute glass particles while keeping a constant distance between the glass growth surface 110a of the glass ingot 110 and the burner 104 until the glass ingot 110 has a desired length.

At the start of feeding of the $SiO_2$ precursor and $TiO_2$ precursor, the ratio of the feed rate of the $TiO_2$ precursor to that of the $SiO_2$ precursor is adjusted to a value lower than a target value. For instance, this ratio is adjusted to make the value in which concentration of $TiO_2$ in the $SiO_2$—$TiO_2$ based glass equal to or smaller than 4 mass % (4 wt %).

Subsequently, the ratio of the feed rate of the $TiO_2$ precursor to that of the $SiO_2$ precursor is gradually increased in stages as the glass ingot 110 grows while maintaining the temperature of the growth surface 110a of the glass ingot 110 within the range of 1600° C. to 1800° C. (first step). The reason for this is as follows. At temperatures of the growth surface 110a below 1600° C., the viscosity of the growth surface 110a and reduces its fluidity, which may cause local convexes to occur on the growth surface 110a. Conversely, at temperatures of the growth surface 110a exceeding 1800° C., the glass ingot 110 vaporizes remarkably to lower its deposition efficiency. In any event, the glass ingot 110 fails to grow efficiently.

Specifically, the increase in stages of the ratio of the feed rate of $TiO_2$ precursor to that of the $SiO_2$ precursor is adjusted to give an increment of the $TiO_2$ concentration in the $SiO_2$—$TiO_2$ based glass per stage being 1 mass % or less. Furthermore, such an increase is adjusted to give an increment of the $TiO_2$ concentration in the $SiO_2$—$TiO_2$ based glass per centimeter (cm) being 1 mass % or less.

When the ratio of the feed rate of the $TiO_2$ precursor to that of the $SiO_2$ precursor is reached to the target value, the ratio is kept constant onward to grow the glass ingot 110 steadily (second step).

As the $SiO_2$ precursor, gases containing a silicon compound such as, for example, silicon tetrachloride ($SiCl_4$), silicon tetrafluoride ($SiF_4$), monosilane ($SiH_4$), or octamethylcyclotetrasiloxane ($C_8H_{24}O_4Si_4$), can be used. As the $TiO_2$ precursor, gases containing a titanium compound such as, for example, titanium tetrachloride ($TiCl_4$), tetraisopropoxytitanium ($Ti(O-i-C_3H_7)_4$), tetrakisdimethylaminotitanium ($Ti[N(CH_3)_2]_4$), can be used.

In this manner, the glass ingot 110 grows on the target member 106 and when the length of the glass ingot 110 reaches to a predetermined value, the manufacture of the $SiO_2$—$TiO_2$ based glass ends. Thus, $SiO_2$—$TiO_2$ based glass in the form of a circular cylinder is obtained.

The ingot growth step of Embodiment #1 adjusts the ratio of the feed rate of $TiO_2$ precursor to that of the $SiO_2$ precursor at the start of feeding the $SiO_2$ precursor and the $TiO_2$ precursor to make the concentration of $TiO_2$ in the $SiO_2$—$TiO_2$ based glass equal to or less than 4 mass % and then gradually increases this ratio as the glass ingot 110 grows while keeping the temperature of the growth surface 110a of the glass ingot 110 within the range of 1600° C. to 1800° C. This enables manufacture of an $SiO_2$—$TiO_2$ based glass ingot having a desired length without any local convexes on the growth surface 110a of the glass ingot 110.

The reason for that as explained above may be as follows. In the reactions for generating $SiO_2$—$TiO_2$ based glass, the hydrolysis reactions of the $SiO_2$ precursor and of the $TiO_2$ precursor are both exothermic, with the amount of heat generated by the hydrolysis reaction of the $TiO_2$ precursor per mole being less than the amount of heat generated by the hydrolysis reaction of the $SiO_2$ precursor per mole. Thus, the greater the ratio of the feed rate of the $TiO_2$ precursor to that of the $SiO_2$ precursor, the temperature of the growth surface 110a of the glass ingot 110 decreases. On the other hand, as the glass ingot 110 grows, it has an increasing volume and thus accumulates more heat. Under the condition in which an adequate amount of heat is provided to the glass ingot 110, a larger volume of the glass ingot 110 has a higher capability of preventing a decrease in temperature at the growth surface 110a. Feeding a large amount of the $TiO_2$ precursor causes noticeable decrease in temperature at the growth surface 110a of the glass ingot 110, and the effect of the increased volume of the glass ingot 110 fails to sufficiently prevent the decrease in temperature at the growth surface 110a of the glass ingot 110. This decreases the temperature at the growth surface 110a of the glass ingot to a temperature below the predetermined lower limit temperature (1600° C.), which in turn increases the viscosity of the glass ingot to form local convexes at the growth surface 110a. Conversely, increasing the feed rate of the $TiO_2$ precursor gradually as in Embodiment #1 causes no noticeable decrease in temperature at the growth surface 110a of the glass ingot 110 and enables growth of the glass ingot 110 with achieving the effect of heat accumulation due to an increased volume of the glass ingot 110. This allows the growth of the glass ingot 110 to be kept at a temperature equal to or higher than the predetermined lower limit temperature (1600° C.), thus enabling the manufacture of the $SiO_2$—$TiO_2$ based glass ingot having a desired length.

Embodiment #1, as described above, heats the target member 106 in the preheating step to allow a sufficient amount of heat to be accumulated in the target member 106 before the synthesis of the glass ingot 110 starts. This enables further prevention of the temperature decrease at the growth surface 110a of the glass ingot 110 in the ingot growth step. This allows the shape of the growth surface 110a of the glass ingot to be maintained for a long period of time and enables the manufacture of a longer glass ingot 110. In other words, this enables the manufacture of the glass ingot 110 having a larger mass for a given diameter.

Embodiment #1, as described above, feeds only the $SiO_2$ precursor into the oxyhydrogen flame to form an $SiO_2$ glass growth surface in the first stage of the ingot growth step. Both the target member 106 and the $SiO_2$ glass layer formed on it serve as a target to increase thermal capacity of the target, thus enabling the temperature of the growth surface 110a of the glass ingot 110 to be maintained for a longer period of time than if only the target member 106 is used.

Furthermore, low-thermal expansion glass formed on $SiO_2$ glass tends to break due to internal stress that occurs upon cooling after the glass synthesis, which is caused by a difference in the coefficient of thermal expansion of the $SiO_2$ glass and that of the low-expansion glass. However, $SiO_2$—$TiO_2$ based glass according to Embodiment #1, which is formed by gradually varying the mix ratio of the dopant (i.e., titanium compound), thus having a coefficient of thermal expansion that varies gradually, will be at considerably low risk for breakage.

Now, a method of manufacturing a photo-mask substrate from the $SiO_2$—$TiO_2$ based glass according to Embodiment #1 as a base material is described.

Figure 2:
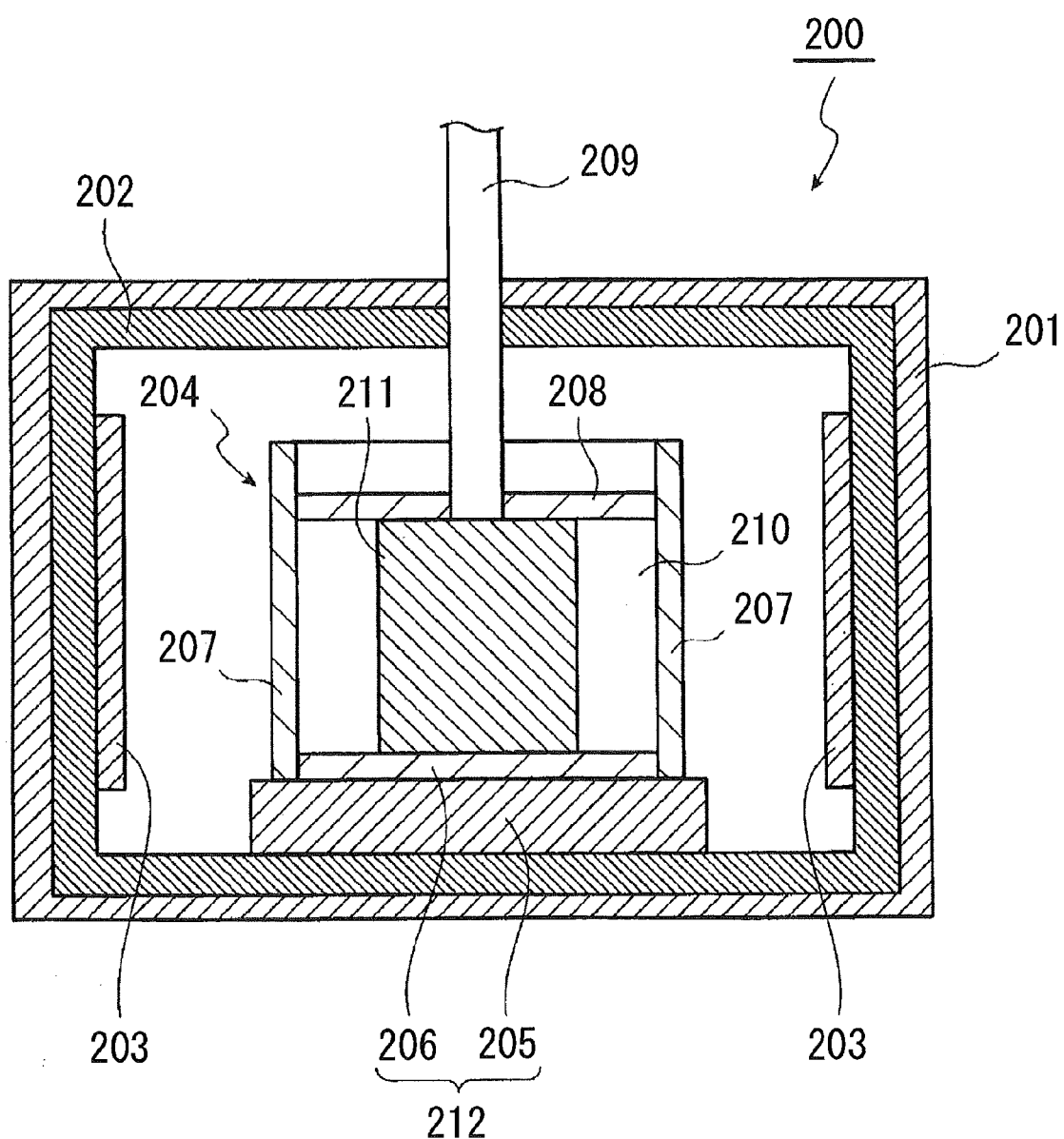
FIG. 2 is a structural diagram showing a glass molding device for use in a manufacturing method for photo-mask substrates according to Embodiment #1 of the present invention.

FIG. 2 is a structural diagram of a glass molding device for use in a manufacturing method for photo-mask substrates. The glass molding device 200 shown in FIG. 2 includes a vacuum chamber 201 made of metal; a heat insulating member 202 that is provided along the entire surface of the inner wall of the vacuum chamber; carbon heaters 203 that are disposed on the side wall portions of the heat insulating member 202; a glass molding die 204 made of carbon that is disposed at the central portion of the vacuum chamber 201; and a cylinder rod 209 that is arranged to contact with the upper surface of the glass molding die 204.

The glass molding die 204 includes a bottom portion 212 having a base plate 205 and a bottom plate 206, side plates 207, and a top plate 208, with a hollow portion 210 of rectangular cross section being defined by a plane crossing the bottom plate 206, the side plates 207, and the top plate 208. The top plate 208 is movable downward, i.e., toward the bottom plate 206 by pressing with the cylinder rod 209.

The manufacture of photo-mask substrates using the molding device shown in FIG. 2 proceeds as follows.

First, $SiO_2$—$TiO_2$ based glass is manufactured in the glass manufacturing step according to Embodiment #1 of the present invention.

Subsequently, in a glass cutting step, the portion of the glass that has grown in the second step (i.e., the portion has no gradation of $TiO_2$ concentration) is cut off from the $SiO_2$—$TiO_2$ based glass manufactured in the glass manufacturing step. In other words, a portion that has grown in the first step is to be removed from the $SiO_2$—$TiO_2$ based glass since such portion has a gradation of $TiO_2$ concentration, which is unsuitable as the material of photo-mask substrates. The portion of the glass that has grown in the second step is worked to remove upper and lower surfaces and side peripheral surface as appropriate and as necessary to, thus forming a glass portion of a circular cylinder.

Finally, in a plate-like member forming step, the portion of glass that has grown in the second step and shaped into a circular cylindrical shape is used as a base material. In this step, the glass portion 211 is subjected to hot pressure forming to form a plate-like member by the following procedure.

First, the glass portion 211 is put into the hollow portion 210 of the glass molding device 200 and the vacuum chamber 201 is evacuated and then filled with an inert gas, which may be, for example, nitrogen gas, argon gas, or helium gas.

Subsequently, the glass molding die 204 and the glass portion 211 are heated up to a predetermined temperature with the carbon heaters 203. Here, a temperature that allows deformation of the glass portion 211 into a desired shape may be used. Specifically, a temperature that is equal to or higher than the crystallization temperature and equal to or lower than its softening temperature of the glass portion 211 may be adopted. Moreover, after the temperature of the glass portion 211 has reached the predetermined temperature, the temperature of the glass portion 211 may be kept at the predetermined temperature over a fixed time period to make the internal temperature more uniform.

After the glass portion 211 has reached the predetermined temperature, the top plate 208 is pressed by the cylinder rod 209 to move downward toward the bottom plate 206, thus allowing for pressure molding the glass portion 211 until it reaches the desired thickness. After cooling, the glass member thus formed in a plate-like is extracted from the molding die 204, Performing appropriate processing upon the member made of $SiO_2$—$TiO_2$ based glass manufactured in this manner as necessary provides a plate-shaped member that can be used for a photo-mask substrate. Such processing includes slicing and grinding for processing to a predetermined size, chamfering for processing its edges to round shapes, polishing for smoothing its surfaces, and the like.

According to the manufacturing method of Embodiment #1, forming the $SiO_2$—$TiO_2$ based glass as a base material into a large sized plate-shaped member allows for the manufacture of a plate-shaped member having a much greater size than the conventional ones and the use of this large-sized plate-shaped member allows for the manufacture of a photo-mask that has a large area and a low thermal expansion. Specifically, this allows for the manufacture of a photo-mask that has a side longer than, for example, 1.2 meters (m) and thus is suitable for the eighth generation onward which is used in manufacturing liquid crystal panels, with its thermal expansion upon irradiation by the exposure light being reduced.

<Other Embodiments>

In the above Embodiment #1, the ingot growth step has been described to include gradually increasing in stages the ratio of the feed rate of the $TiO_2$ precursor to that of the $SiO_2$ precursor as the glass ingot 110 grows. However, such a gradual increase in the ratio of the precursors need not be achieved in stages. For example, the ratio of the precursors may be increased linearly or quadratically over time.

Now, practical example of the present invention is described below. In the practical example, $SiO_2$—$TiO_2$ based glass was made by the manufacturing method according to Embodiment #1. The $SiO_2$ precursor used is $SiCl_4$ and the $TiO_2$ precursor used is $TiCl_4$. However, the present invention is not limited to the practical example.

PRACTICAL EXAMPLE #1

Experiments were conducted under the conditions indicated as Practical Example #1 in Table 1 below. As a target, a piece of $SiO_2$ glass 350 mm in diameter and 120 mm in thickness was prepared. 315 standard liters per minute (slm) of oxygen gas and 775 slm of hydrogen gas were blown out from the burner to generate an oxyhydrogen flame, which continuously heated the target. After four hours from the start of the heating, 30 g/min of $SiCl_4$ gas was fed. Under these conditions, a growth surface of $SiO_2$ glass of 300 mm in diameter was laid upon the upper surface of the target member over 113 hours. The temperature of the growth surface then was 1750° C.

Subsequently, the feed rate of $SiCl_4$ was adjusted to 15 g/min and 0.1 g/min of $TiCl_4$ was mixed with a variation of $TiCl_4$ so that $TiO_2$ doped concentration per cm being 1 mass % or less. This allowed $SiO_2$—$TiO_2$ based glass to grow continuously without generating local convexes at the growth surface until an ingot of 350 mm in diameter and 500 mm long was made when the manufacture of the $SiO_2$—$TiO_2$ based glass was stopped.

As apparent from Table 1, the $TiO_2$ concentration in Practical Example #1 was 0.8 mass % (i.e., equal to or less than 4 mass %). The variation in $TiO_2$ concentration between any two consecutive steps was 0.7 to 0.8 mass % (i.e., equal to or less than 1 mass %). In addition, The increase in $TiO_2$ concentration per cm of the length of glass ingot was 0.12 to 0.8 mass % (i.e., equal to or less than 1 mass %). This allowed for the manufacture of glass ingot with keeping the shape of the growth surface constant.

COMPARATIVE EXAMPLE #1

Experiment was carried out under the conditions indicated as Comparative Example #1. As a target member, a piece of $SiO_2$ glass 350 mm in diameter and 120 mm in thickness was prepared. 347 slm of oxygen gas and 930 slm of hydrogen gas were blown out from the burner to generate an oxyhydrogen flame, which continuously heated the target. After four hours from the start of the heating, 30 g/min of $SiCl_4$ gas was fed. Under these conditions, a growth surface of SiO$_2$ glass of 300 mm in diameter was laid upon the upper surface of the target over 40 hours. The temperature of the growth surface then was 1745° C.

Subsequently, 1.2 g/min of TiCl$_4$ was mixed with 30 g/min of SiCl$_4$ to make the concentration of the TiO$_2$ in the resultant glass 4.6 mass %. To eliminate any possible local convexes due to a decrease in temperature at the growth surface which could occur upon mixing of the TiCl$_4$, amount of feed rate of oxygen and hydrogen gases was increased to supply heat upon mixing TiCl$_4$. However, after 30 hours from the start of the mixing, local convexes occurred at the growth surface and continuous manufacture of the SiO$_2$—TiO$_2$ based glass failed any further.

As apparent from Table 1, the concentration of TiO$_2$ in Comparative Example #1 was 4.6 mass % (i.e., greater than 4 mass %). This caused failure of the growth surface to be maintained in stable.

COMPARATIVE EXAMPLE #2

Experiments were conducted under the conditions indicated as Comparative Example #2 in Table 1 below. As a target, a piece of SiO$_2$ glass 350 mm in diameter and 120 mm in thickness was prepared. 377 slm of oxygen gas and 930 slm of hydrogen gas were blown out from the burner to generate an oxyhydrogen flame, which continuously heated the target. After four hours from the start of the heating, 30 g/min of SiCl$_4$ gas was fed. Under these conditions, a growth surface of SiO$_2$ glass of 300 mm in diameter was laid upon the upper surface of the target over 1 hour. The temperature of the growth surface then was 1700° C.

Subsequently, to decrease the feed rate of SiCl$_4$ and make the concentration of TiO$_2$ in the resultant glass 4.6 mass %, 10 g/min of SiCl$_4$ and 0.4 g/min of TiCl$_4$ were mixed. While maintaining the ratio of the feed rate of TiCl$_4$ to that of SiCl$_4$ constant, the feed rate of SiCl$_4$ was increased by 10 g/min each hour and the feed rate of TiCl$_4$ was increased by 0.4 g/min each hour until the feed rate of 30 g/min and the feed rate of SiCl$_4$ and of 1.2 g/min of TiCl$_4$ were reached. After 20 hours, local convexes occurred at the growth surface, which disallowed for continuous manufacture of SiO$_2$—TiO$_2$ based glass any further. The flow rates of the oxygen gas and hydrogen gas was kept constant under the conditions mentioned above.

As apparent from Table 1, the concentration of TiO$_2$ in Comparative Example #2 was 4.6 mass % (i.e., greater than 4 mass %). This caused failure of the growth surface to be maintained in stable.

COMPARATIVE EXAMPLE #3

Experiments were conducted under the conditions indicated as Comparative Example #3 in Table 1 below. As a target, a piece of SiO$_2$ glass 350 mm in diameter and 120 mm in thickness was prepared. 335 slm of oxygen gas and 830 slm of hydrogen gas were blown out from the burner to generate an oxyhydrogen flame, which continuously heated the target. After four hours from the start of the heating, 40 g/min of SiCl$_4$ gas was fed. Under these conditions, a growth surface of SiO$_2$ glass of 300 mm in diameter was laid upon the upper surface of the target over 191 hour. The temperature of the growth surface then was 1550° C.

Subsequently, the feed rate of SiCl$_4$ was changed to 20 g/min. The feed rate of oxygen and hydrogen gases was increased by approximately 30 slm in total and 0.2 g/min of TiCl$_4$ was mixed. After 71 hours, the feed rate of oxygen and hydrogen gases was increased by 105 slm. After 42 hours, the feed rate of TiCl$_4$ was changed to 0.4 g/min and the feed rate of oxygen and hydrogen gases was increased by 34 slm. However, after 30 hours from this, local convexes occurred at the growth surface, which disallowed for continuous manufacture of SiO$_2$—TiO$_2$ based glass any further.

As apparent from Table 1, the variation in concentration of TiO$_2$ in the resultant glass between the penultimate stage and the last stage in Comparative Example #3 was 1.1 mass % (i.e., greater than 1 mass %). This caused failure of the growth surface to be maintained in stable.

COMPARATIVE EXAMPLE #4

Experiments were conducted under the conditions indicated as Comparative Example #4 in Table 1 below. As a target, a piece of SiO$_2$ glass 350 mm in diameter and 120 mm in thickness was prepared. 306 slm of oxygen gas and 760 slm of hydrogen gas were blown out from the burner to generate an oxyhydrogen flame, which flame continuously heated the target. After four hours from the start of the heating, 30 g/min of SiCl$_4$ gas was fed. Under these conditions, a growth surface of SiO$_2$ glass of 300 mm in diameter was laid upon the upper surface of the target over 24 hour. The temperature of the growth surface then was 1750° C.

Subsequently, the feed rate of SiCl$_4$ was changed to 15 g/min and 0.25 g/min of TiCl$_4$ was fed. Then, after 24 hours, 0.4 g/min of TiCl$_4$ was fed at the constant feed rate of 15 g/min of SiCl$_4$. After further 73 hours, 0.5 g/min of TiCl$_4$ was fed. After further 30 hours, local convexes occurred at the growth surface. This disallowed for continuous manufacture of SiO$_2$—TiO$_2$ glass any further.

As apparent from Table 1, the variation in concentration of TiO$_2$ in the resultant glass in the third stage (i.e., in the stage in which the flow rate of TiCl$_4$ was changed to 0.4 g/min) in Comparative Example #3 was 1.2 mass % (i.e., greater than 1 mass %). This caused failure of the growth surface to be maintained in stable.

TABLE 1

| | | SiCl$_4$ Feed rate (g/min) | TiCl$_4$ Feed rate (g/min) | O$_2$ Feed rate (slm) | H$_2$ Feed rate (slm) | TiO$_2$ Concentration in glass ingot (mass %) | Length of ingot at the start of each stage | Time period for each stage (h) |
|---|---|---|---|---|---|---|---|---|
| Practical Example #1 | Start of feeding SiCl$_4$ | 30 | 0 | 315 | 775 | 0.0 | 120 (Length of target) | 113 |
| | Start of feeding TiCl$_4$ | 15 | 0.1 | 314 | 775 | 0.8 | 304 | 28 |
| | | 15 | 0.2 | 321 | 795 | 1.6 | 319 | 115 |
| | | 15 | 0.3 | 319 | 800 | 2.3 | 376 | 26 |
| | | 15 | 0.4 | 322 | 810 | 3.1 | 386 | 47 |

TABLE 1-continued

| | | SiCl$_4$ Feed rate (g/min) | TiCl$_4$ Feed rate (g/min) | O$_2$ Feed rate (slm) | H$_2$ Feed rate (slm) | TiO$_2$ Concentration in glass ingot (mass %) | Length of ingot at the start of each stage | Time period for each stage (h) |
|---|---|---|---|---|---|---|---|---|
| | | 15 | 0.5 | 317 | 800 | 3.8 | 402 | 96 |
| | | 15 | 0.6 | 318 | 805 | 4.6 | 441 | The ingot grew to 500 mm in 123 h |
| Comparative Example #1 | Start of feeding SiCl$_4$ | 30 | 0 | 347 | 930 | 0 | 0 | 40 |
| | Start of feeding TiCl$_4$ | 30 | 1.2 | 365 | 960 | 4.6 | 237 | After 30 hours, convexes occurred at growth surface |
| Comparative Example #2 | Start of feeding SiCl$_4$ | 30 | 0 | 377 | 930 | 0 | 120 (Length of target) | 1 |
| | Start of feeding TiCl$_4$ | 10 | 0.4 | 372 | 920 | 4.6 | 120 | 1 |
| | | 20 | 0.8 | 372 | 920 | 4.6 | 120 | 1 |
| | | 30 | 1.2 | 372 | 920 | 4.6 | 120 | After 20 hours, convexes occurred at growth surface |
| Comparative Example #3 | Start of feeding SiCl$_4$ | 40 | 0 | 335 | 830 | 0 | 120 (Length of target) | 191 |
| | Start of feeding TiCl$_4$ | 20 | 0.2 | 342 | 850 | 1.2 | 404 | 71 |
| | | 20 | 0.2 | 372 | 925 | 1.2 | 438 | 42 |
| | | 20 | 0.4 | 381 | 950 | 2.3 | 445 | After 30 hours, convexes occurred at growth surface |
| Comparative Example #4 | Start of feeding SiCl$_4$ | 30 | 0 | 306 | 760 | 0 | 120 (Length of target) | 24 |
| | Start of feeding TiCl$_4$ | 15 | 0.25 | 316 | 790 | 1.9 | 304 | 24 |
| | | 15 | 0.4 | 326 | 815 | 3.1 | 327 | 73 |
| | | 15 | 0.5 | 342 | 860 | 3.8 | 359 | After 30 hours, convexes occurred at growth surface |

Various embodiments and variations have been explained above. However, the present invention is not limited thereto.

What is claimed is:

1. A method for manufacturing an SiO$_2$-TiO$_2$ based glass having a desired TiO$_2$ concentration upon a target by a direct method, comprising:
   growing an SiO$_2$-TiO$_2$ based glass ingot on the target by flame hydrolysis by feeding a silicon compound and a titanium compound into an oxyhydrogen flame,
   wherein the growing includes:
   growing an initial portion of the SiO$_2$-TiO$_2$ based glass ingot by feeding the titanium compound and the silicon compound into the oxyhydrogen flame in respective feed rates such that the initial portion has a TiO$_2$ concentration smaller than the desired TiO$_2$ concentration,
   while further feeding the titanium compound and the silicon compound to grow a first further portion of the SiO$_2$-TiO$_2$ based glass ingot on the initial portion, increasing a ratio of the feed rate of the titanium compound to the feed rate of the silicon compound until the first further portion starts growing at the desired TiO$_2$ concentration, and
   then, growing a second further portion of the SiO$_2$-TiO$_2$ based glass ingot while maintaining the second further portion at the desired TiO$_2$ concentration,
   wherein the ratio is adjusted in stages such that an increment of concentration of TiO$_2$ per cm of the length of the first further portion of the SiO$_2$-TiO$_2$ based glass ingot is equal to or less than 1 mass %.

2. A method for manufacturing an SiO$_2$-TiO$_2$ based glass having a desired TiO$_2$ concentration upon a target by a direct method, comprising:
   growing an SiO$_2$-TiO$_2$ based glass ingot on the target by flame hydrolysis by feeding a silicon compound and a titanium compound into an oxyhydrogen flame,
   wherein the growing includes:
   growing an initial portion of the SiO$_2$-TiO$_2$ based glass ingot by feeding the titanium compound and the silicon compound into the oxyhydrogen flame in respective feed rates such that the initial portion has a TiO$_2$ concentration smaller than the desired TiO$_2$ concentration,
   while further feeding the titanium compound and the silicon compound to grow a first further portion of the SiO$_2$-TiO$_2$ based glass ingot on the initial portion, increasing a ratio of the feed rate of the titanium compound to the feed rate of the silicon compound until the first further portion starts growing at the desired TiO$_2$ concentration, and
   then, growing a second further portion of the SiO$_2$-TiO$_2$ based glass ingot while maintaining the second further portion at the desired TiO$_2$ concentration,
   wherein the ratio at a start of feeding the silicon compound and the titanium compound is adjusted such that the concentration of TiO$_2$ in the initial portion of the SiO$_2$-TiO$_2$ based glass is equal to or less than 4 mass %.

3. The method for manufacturing an SiO$_2$-TiO$_2$ based glass according to claim 2, wherein:
   in the increasing the ratio, the ratio is gradually increased such that the temperature of the growth surface of the first further portion of SiO$_2$-TiO$_2$ based glass ingot is maintained at a temperature equal to or higher than a predetermined lower limit temperature.

4. The method for manufacturing an SiO$_2$-TiO$_2$ based glass according to claim 3, wherein:
   the predetermined lower limit temperature is 1600 ° C.

5. The method for manufacturing an SiO$_2$-TiO$_2$ based glass according to claim 2, wherein:
   in the increasing the ratio, the ratio is increased in stages.

6. The method for manufacturing an $SiO_2$-$TiO_2$ based glass according to claim 2, wherein:
   the silicon compound is silicon tetrachloride.

7. The method for manufacturing an $SiO_2$-$TiO_2$ based glass according to claim 2, wherein:
   the titanium compound comprises titanium tetrachloride, tetraisopropoxytitanium or tetrakisdimethylaminotitanium.

8. The method for manufacturing an $SiO_2$-$TiO_2$ based glass according to claim 2, further comprising:
   a preheating process of preheating the target prior to the ingot growing process.

9. The method for manufacturing an $SiO_2$-$TiO_2$ based glass according to claim 2, wherein:
   in the ingot growing, only the silicon compound is fed into the oxyhydrogen flame to form a growth surface of an $SiO_2$ glass and subsequently feeding of the titanium compound is started.

10. A method for manufacturing a photomask substrate, the method comprising:
    manufacturing an $SiO_2$-$TiO_2$ based glass by the method for manufacturing an $SiO_2$-$TiO_2$ based glass according to claim 2;
    cutting out the second further portion from the manufactured $SiO_2$-$TiO_2$ based glass; and
    forming a plate-shaped member by hot pressure forming the glass portion which was cut out in the cutting.

* * * * *